(12) United States Patent
Chang et al.

(10) Patent No.: US 9,152,039 B2
(45) Date of Patent: Oct. 6, 2015

(54) MULTIPLE PATTERNING TECHNOLOGY METHOD AND SYSTEM FOR ACHIEVING MINIMAL PATTERN MISMATCH

(75) Inventors: Feng-Ming Chang, Chia-Yi (TW); Chang-Ta Yang, Hsinchu (TW); Ping-Wei Wang, Hsin-Chu (TW); Min Cao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 303 days.

(21) Appl. No.: 13/275,899

(22) Filed: Oct. 18, 2011

(65) Prior Publication Data

US 2013/0094035 A1    Apr. 18, 2013

(51) Int. Cl.
| | |
|---|---|
| G06F 17/50 | (2006.01) |
| G03F 1/68 | (2012.01) |
| H01L 27/02 | (2006.01) |
| G03F 7/00 | (2006.01) |
| H01L 27/11 | (2006.01) |

(52) U.S. Cl.
CPC .............. *G03F 1/68* (2013.01); *H01L 27/0207* (2013.01); *G03F 7/0005* (2013.01); *H01L 27/1104* (2013.01)

(58) Field of Classification Search
CPC ................................. G06F 17/30; G06F 17/50

USPC ........ 716/55; 348/218.1, 69, 208.1, E05.031; 257/E31.127, E27.133

See application file for complete search history.

(56) References Cited

U.S. PATENT DOCUMENTS

| | | | |
|---|---|---|---|
| 2006/0036977 A1* | 2/2006 | Cohn et al. ......................... 716/4 |
| 2008/0307381 A1* | 12/2008 | Tritchkov et al. ................ 716/11 |
| 2011/0280094 A1* | 11/2011 | Heymann et al. .............. 365/226 |
| 2012/0108036 A1* | 5/2012 | Chang et al. .................... 438/478 |
| 2012/0167029 A1* | 6/2012 | Cohn et al. ...................... 716/112 |
| 2014/0245238 A1* | 8/2014 | Wang et al. ....................... 716/52 |

OTHER PUBLICATIONS

Unpublished U.S. Appl. No. 12/917,205, filed Nov. 1, 2010 entitled "Active Region Patterning in Double Patterning Process", 35 pages.

* cited by examiner

*Primary Examiner* — Mohammed Alam
(74) *Attorney, Agent, or Firm* — Haynes and Boone, LLP

(57) ABSTRACT

The present disclosure provides for many different embodiments of a multiple patterning technology method and system. An exemplary method includes receiving a pattern layout having a plurality of features; coloring each of the plurality of features one of at least two colors, thereby forming a colored pattern layout, wherein the coloring includes coloring match-sensitive features a same color; and fabricating at least two masks with the features of the colored pattern layout, wherein each mask includes features of a single color.

16 Claims, 17 Drawing Sheets

Receive a pattern layout having a plurality of features. ~52

Color each of the plurality of features one of at least two colors, thereby forming a colored pattern layout, wherein match-sensitive features are colored a same color. ~54

Fabricate at least two masks with the features of the colored pattern layout, wherein each mask includes features of a single color. ~56

MULTIPLE PATTERNING TECHNOLOGY METHOD AND SYSTEM FOR ACHIEVING MINIMAL PATTERN MISMATCH

BACKGROUND

Integrated circuit (IC) technologies are constantly being improved. Such improvements frequently involve scaling down device geometries to achieve lower fabrication costs, higher device integration density, higher speeds, and better performance. Photolithography is frequently used for forming components of an integrated circuit device. Generally, an exposure tool passes light through a photomask or reticle and focuses the light onto a photoresist layer of a wafer, resulting in the photoresist layer having an image of integrated circuit components therein. Printing device patterns with small spacings is limited by a minimum pitch printing resolution of the exposure tool. Multiple patterning technology (MPT) has thus been implemented to improve pattern resolution as device densities increase. MPT separates a pattern layout into more than one mask, essentially assigning features of the pattern layout to several masks. The masks associated with the pattern layout are then used to transfer the pattern layout to a wafer, thereby pushing photolithography's limits.

To achieve pattern layouts that are MPT compliant, an exemplary MPT method assigns each feature of the pattern layout either a first color or a second color based on various MPT rules. Features assigned the first color are formed on a first mask, and features assigned the second color are formed on a second mask. Each mask is then used in a photolithography process to transfer the features assigned on the first mask and the second mask to a wafer, such that the wafer includes the pattern layout. It has been observed that when portions of the pattern layout that are associated with a given device are split into more than one mask, and thus, more than one lithography step, routing and device characteristic variations may occur. This can lead to device performance degradation. Accordingly, although existing multiple patterning technology methods have been generally adequate for their intended purposes, as device scaling down continues, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
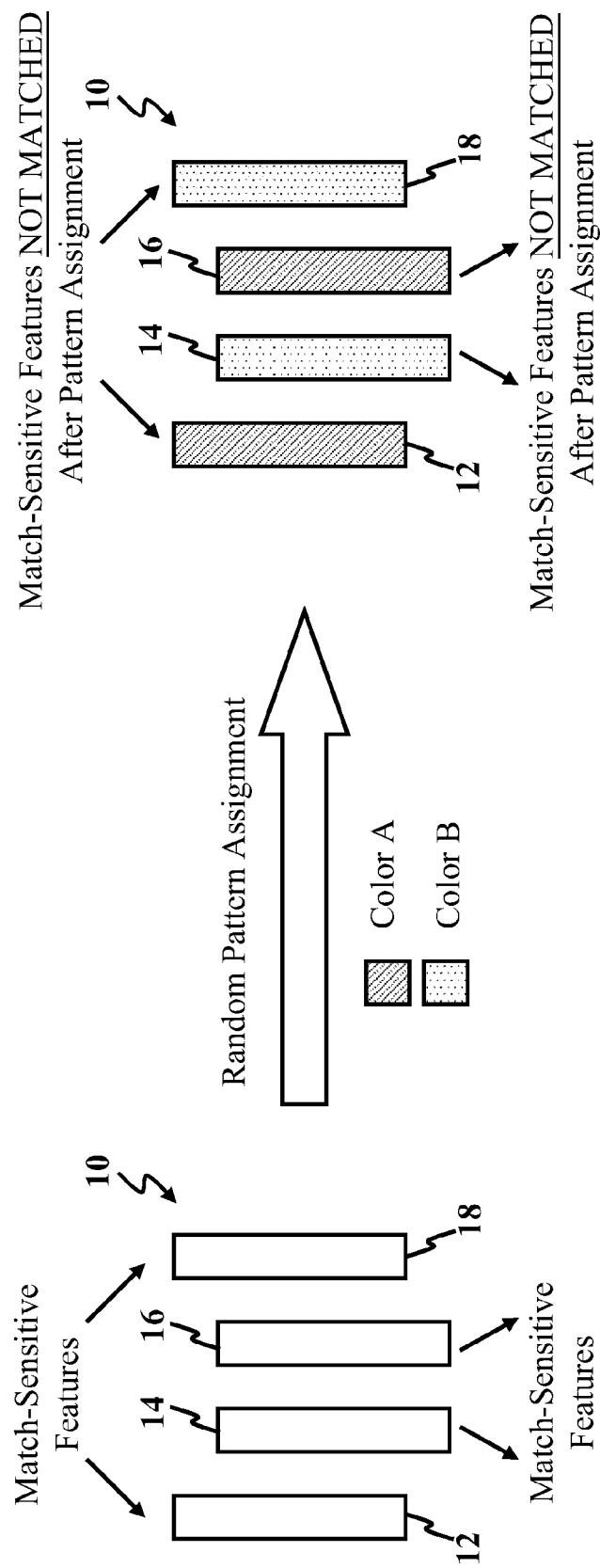
FIG. 1A and FIG. 1B illustrate a pattern layout that is evaluated and decomposed according to different multiple patterning technology methods according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1B:
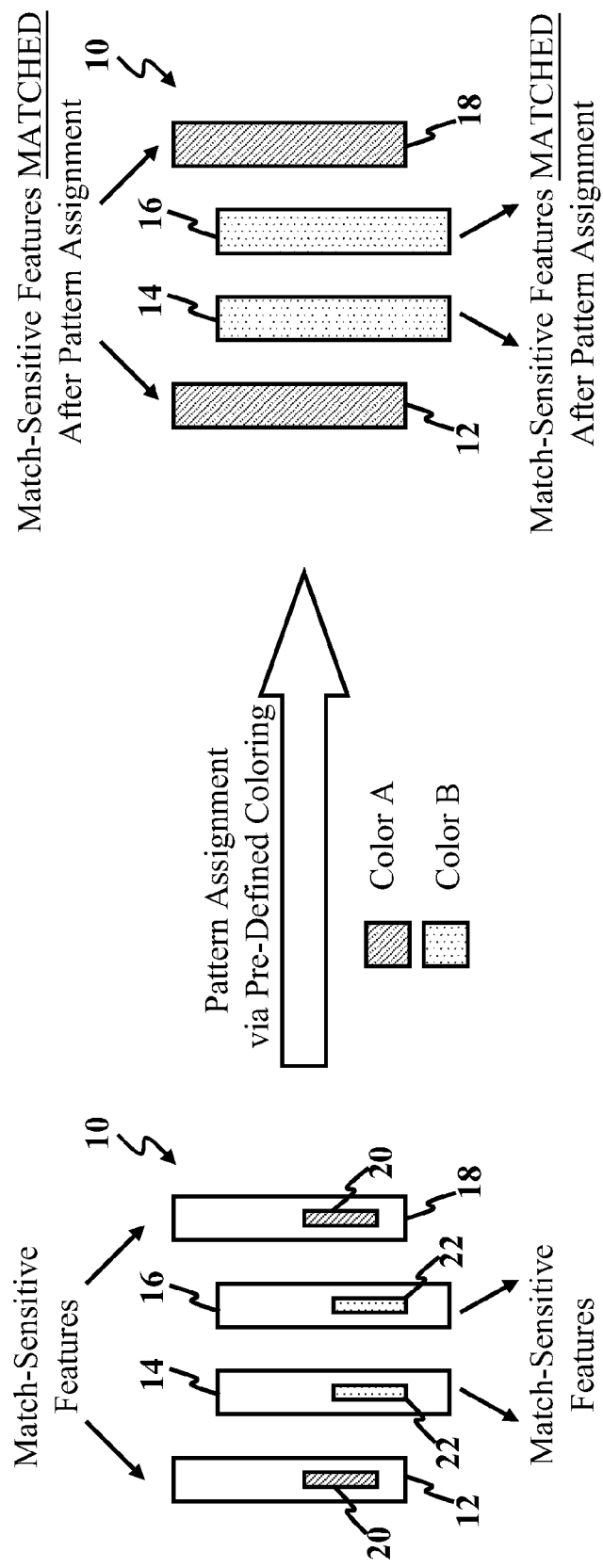

FIG. 1A and FIG. 1B illustrate a pattern layout 10 that is evaluated and decomposed using different multiple patterning technology methods according to various aspects of the present disclosure. The pattern layout 10 represents a layout of a portion of an integrated circuit device. Typically, an integrated circuit device is fabricated using multiple pattern layouts, each pattern layout defining a layer of the integrated circuit device. In the depicted embodiment, for simplicity and clarity, the example herein will refer to a single pattern layout. However, the methods disclosed herein are intended to be implemented with all pattern layouts of the integrated circuit device. The pattern layout 10 (also referred to as a design layout) may be provided in a computer aided design (CAD) format, such as a GDS format. In the depicted embodiment, pattern layout 10 includes features (or patterns) 12, 14, 16, and 18. The features 12, 14, 16, and 18 may represent active regions, isolation features, gate lines, metal lines, dielectric lines, contacts, trenches, other integrated circuit device features, or combinations thereof that form the integrated circuit device. The features 12, 14, 16, and 18 of the pattern layout 10 may be shaped as lines, line ends, contact holes, elbow shapes, T-shapes, L-shapes, Z-shapes, other suitable shapes, or combinations thereof. For example, features 12, 14, 16, and 18 are shaped as lines extending in directions parallel to one another.

As device scaling down continues, a pattern layout, such as the pattern layout 10, is decomposed (or split) according to a multiple patterning technology (MPT) method so that more than one mask can be fabricated that includes the features of the pattern layout. In FIG. 1A, the MPT method applies random pattern assignment to the pattern layout 10 based on various MPT rules. The random pattern assignment may assign two colors to the features of the pattern layout, randomly assigning every other feature a same color, such that features 12, 14, 16, and 18 of the pattern layout 10 are assigned one of two colors, Color A or Color B. Alternatively, the features of the pattern layout 10 may be assigned with three colors, four colors, or any other number of colors depending on how many masks the pattern layout 10 will be split (decomposed) into. It is noted that "coloring" refers to grouping the features by an assignment criteria, such that each of the features is assigned to a group. "Coloring" does not require actual "coloring" of the features, and may include assigning different layer numbers or different layer data types to the features to represent different "colors." In the depicted embodiment, features 12 and 16 are assigned Color A, and features 14 and 18 are assigned Color B.

After coloring, in the depicted embodiment, spacing between the various features 12, 14, 16, and 18 of the same color comply with design rules, such as space and pitch design rules, and thus, the pattern layout 10 is decomposed into two masks, where features assigned Color A (here, features 12 and 16) are formed on a first mask and features assigned Color B (here, features 14 and 18) are formed on a second mask. The features 12, 14, 16, and 18 defined on the first and second masks represent the pattern layout 10. Each mask is then used in a lithography process (in no particular order) to print an image of the pattern layout 10 into a resist layer during integrated circuit device manufacturing, such that the pattern layout 10 can be transferred to and formed on a wafer of the integrated circuit device. Accordingly, two lithography processes are used to transfer the features 12, 14, 16, and 18 of the pattern layout 10 to the wafer—for example, a first lithography process using the first mask and a second lithography process using the second mask.

Processing conditions of the various lithography processes (here, the double lithography processes) may vary when transferring the pattern layout 10 into the resist layer, which can lead to integrated circuit device feature mismatch and/or routing mismatch, thereby degrading performance of the manufactured integrated circuit device. For example, in the depicted embodiment, feature 12 and feature 18 may be match-sensitive features, and feature 14 and feature 16 may be match-sensitive features. Match-sensitive features are generally defined as features that are desirably formed in a same lithography process. More specifically, match-sensitive features are defined as features having a same device performance characteristic, such as threshold voltage, leakage current, saturation current, parasitic resistance, parasitic capacitance, other device performance characteristic, or combinations thereof. In an example, the match-sensitive features have symmetrical routing paths. Using the random pattern assignment illustrated in FIG. 1A, the feature 12 is not matched to the same mask as feature 18, and the feature 14 is not matched to the same mask as feature 16. Since the match-sensitive features are assigned to different masks, process variations in the lithography processes using the different masks can result in the feature 12 and the feature 18 performing differently from one another and/or not being properly routed, and the feature 14 and the feature 16 performing differently from one another, not being properly routed, and/or diminished symmetry. Such process variations may include overlay error, critical dimension variation arising from variations in developing processes and/or etching processes (such as varying etching biases), other process variations, or combinations thereof. The mismatched sensitive features resulting from the MPT method illustrated in FIG. 1A (feature 12 and feature 18, feature 14 and feature 16) can thus lead to integrated circuit device performance degradation when the decomposed pattern layout 10 is used to form the integrated circuit device. For example, if the match-sensitive features represent active regions of an integrated circuit device, and the match-sensitive features are assigned to different masks, etching bias differences during processing may result in varying widths of the active regions, and thus lead to different saturation currents.

To address issues associated with the MPT method illustrated in FIG. 1A, the MPT method illustrated in FIG. 1B identifies match-sensitive features of the pattern layout 10 before coloring and decomposing the pattern layout 10 into more than one mask. For example, the MPT method identifies feature 12 and feature 18 as match-sensitive features, and feature 14 and feature 16 as match-sensitive features. In the depicted embodiment, each set of match-sensitive features is pre-assigned one of the two colors, Color A or Color B. Alternatively, the match-sensitive features of the pattern layout 10 may be assigned with three colors, four colors, or any other number of colors depending on how many masks the pattern layout 10 will be split (decomposed) into. In yet another alternative, assignment of the match-sensitive features of the pattern layout 10 may be encrypted. For example, the pattern layout 10 may be split (decomposed) into groups of colors, where each group includes one or more colors assigned thereto, such that match-sensitive features of the pattern layout 10 may be assigned different colors yet belong to the same group. Other variations of pattern assignment are contemplated by the present disclosure, so long as the match-sensitive features are identified. In the depicted embodiment, feature 12 and feature 16 are pre-assigned Color A as indicated by color indicators 20, and feature 14 and feature 18 are pre-assigned Color B as indicated by color indicators 22. After the match-sensitive features are identified and pre-assigned a color, conventional MPT methods may assign features of the pattern layout 10 one of the two colors. In the depicted embodiment, the MPT method automatically assigns the match-sensitive features their pre-assigned colors, and may randomly assign other features of the pattern layout 10 (in other words, features that are not match-sensitive) one of the two colors. The colored pattern layout thus includes features 12 and 18 colored the same color, Color A, and features 14 and 16 colored the same color, Color B. In another example, the match-sensitive features 12 and 18, and the match-sensitive features 14 and 16, are simply identified as match-sensitive features, such that the MPT method automatically assigns each set of match-sensitive features (features 12 and 18 and features 14 and 16) a same color while assigning the other, not match-sensitive features colors. Accordingly, a "color indicator" is not required, so long as the match-sensitive features are identified before coloring.

After coloring, spacing between the various features 12, 14, 16, and 18 of the same color comply with design rules, such as space and pitch design rules, and thus, the pattern layout 10 is decomposed into two masks, where features assigned Color A (here, features 12 and 18) are formed on a first mask and features assigned Color B (here, features 14 and 16) are formed on a second mask. The match-sensitive features 12 and 18 are thus formed on the same mask, and the match-sensitive features 14 and 16 are thus formed on the same mask. The features 12, 14, 16, and 18 defined on the first and second masks represent the pattern layout 10. Each mask is then used in a lithography process (in no particular order) to print an image of the pattern layout 10 into a resist layer during integrated circuit device manufacturing, such that the pattern layout 10 can be transferred to and formed on a wafer of the integrated circuit device. Accordingly, two lithography processes are used to transfer the features 12, 14, 16, and 18 of the pattern layout 10 to the wafer—for example, a first lithography process using the first mask and a second lithography process using the second mask. In the depicted embodiment, match-sensitive features 12 and 18 formed on the same mask are formed in the same lithography process, and match-sensitive features 14 and 16 formed on the same mask are formed in the same lithography process. This can minimize performance variation between the match-sensitive features 12 and 18 and match-sensitive features 14 and 16. This can also maintain symmetry between the match-sensitive features 12 and 18 and match-sensitive features 14 and 16.

Figure 2:
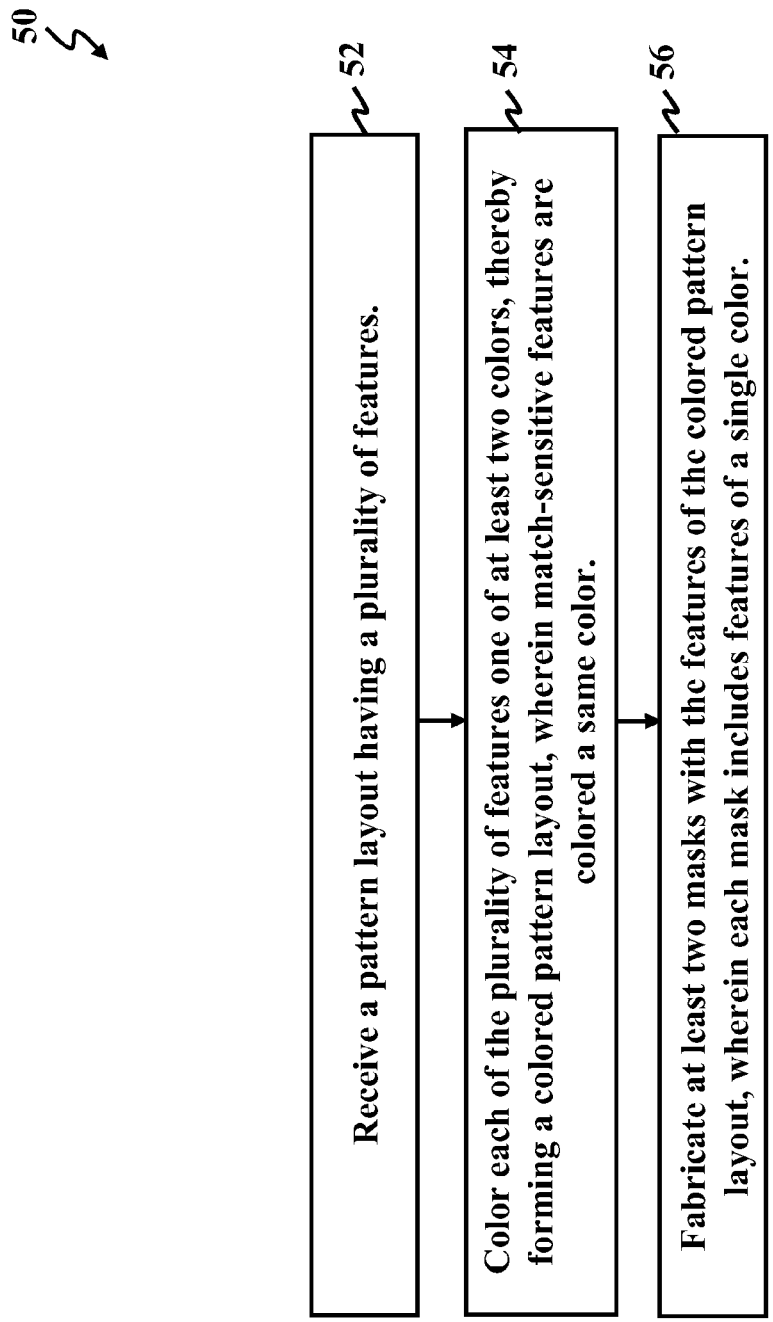
FIG. 2 is a flow chart of a multiple patterning technology method for decomposing a design layout according to various aspects of the present disclosure.

FIG. 2 is a flow chart of a multiple patterning technology method 50 for decomposing a design layout according to various aspects of the present disclosure. The method 10 begins at blocks 52 where a pattern layout having a plurality of features is received. The pattern layout may be represent an integrated circuit device to be fabricated. In an example, the pattern layout identifies match-sensitive features of the plurality of features. In an example, a mask house receives the pattern layout from a design house. At block 54, each of the plurality of features is colored one of at least two colors, thereby forming a colored pattern layout. Match-sensitive features of the plurality of features are colored a same color. A design rule check may be performed to ensure that features of a same color comply with various design rules for the integrated circuit device. Then, at block 56, at least two masks are generated with the features of the colored pattern layout. Each mask includes features of a single color. For example, if the features of the colored pattern layout are colored one of a first color and a second color, a first mask having features of the first color and a second mask having features of the second color are fabricated. Such masks may be used to form the plurality of features of the pattern layout in a wafer of the integrated circuit device. Additional steps can be provided before, during, and after the method 50, and some of the steps described can be replaced or eliminated for other embodiments of the method. The discussion associated with FIG. 1B implements the method 50 to decompose the pattern layout 10, and the discussion that follows illustrates various embodiments for decomposing design layouts according to the method 50 of FIG. 2.

Figures 3A, 3B:
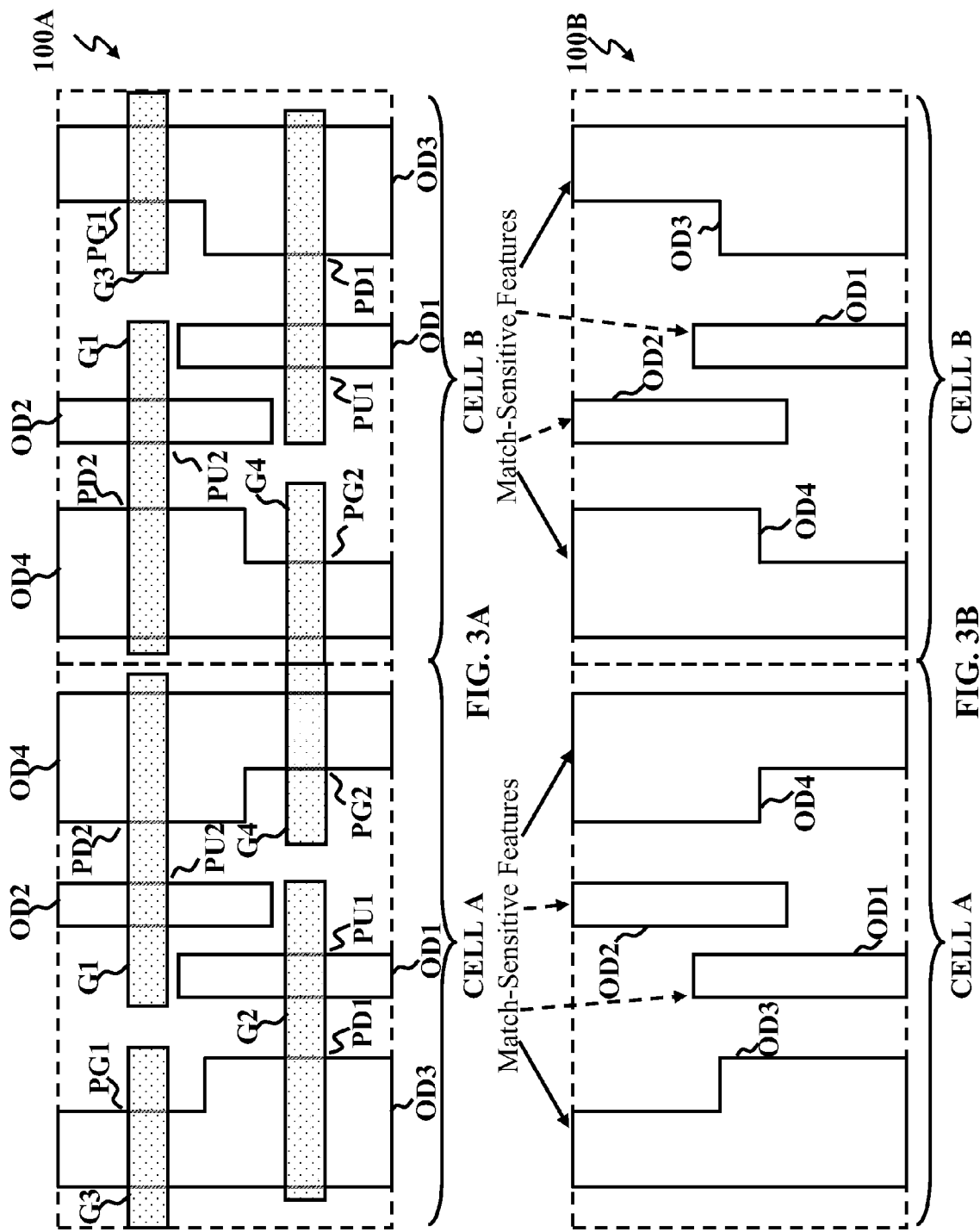
FIG. 3A and FIG. 3B illustrate pattern layouts of an integrated circuit device, in portion or entirety, according to various aspects of the present disclosure.

FIG. 3A and FIG. 3B illustrate pattern layouts of an integrated circuit device, in portion or entirety, according to various aspects of the present disclosure. In the depicted embodiment, FIG. 3A illustrates a pattern layout 100A that includes neighboring six-transistor (6-T) single-port static random access memory (SRAM) cells, Cell A and Cell B. Each cell, Cell A and Cell B, have rotationally symmetrical patterns, meaning that the features of each cell are symmetrically relative to a central point. For example, Cell A and Cell B include active regions designated as OD1, OD2, OD3, and OD3 and gate structures designated as G1, G2, G3, and G3, where the active regions and gate structures of Cell A and Cell B are rotationally symmetrical. The gate structures are disposed over the active regions, and the active regions may include source regions, drain regions, and channel regions. The gate structures and active regions are configured to form the various transistors of Cell A and Cell B. For example, the SRAM Cell A and SRAM Cell B each include pull-up transistors, PU1 and PU2, pull-down transistors, PD1 and PD2, and pass-gate transistors, PG1 and PG2. PU1 is formed by the gate structure G2 and the active region OD1, which includes a source region, drain region, and channel for PU1; PU2 is formed by the gate structure G1 and the active region OD2, which includes a source region, drain region, and channel for PU2; PD1 is formed by the gate structure G2 and the active region OD3, which includes a source region, drain region, and channel for PD1; PD2 is formed by the gate structure G2 and the active region OD3, which includes a source region, drain region, and channel for PD2; PG1 is formed by the gate structure G3 and the active region OD3, which includes a source region, drain region, and channel for PG1; and PG2 is formed by the gate structure G3 and the active region OD3, which includes a source region, drain region, and channel for PG2. In FIG. 3B, the pattern layout 100A may be reduced to a pattern layout 100B that includes only the active regions OD1, OD2, OD3, and OD3 of the SRAM cells. The pattern layout 100B may be used to form at least two masks for use in a lithography process that forms the active regions OD1, OD2, OD3, and OD3 on a wafer.

Since active regions OD1 and OD2 are used to form the pull-up transistors PU1 and PU2, which will perform similarly, it is desired that characteristics of the active region OD1 are substantially similar to characteristics of the active region OD2. Further, since active regions OD3 and OD3 are used to form the pull-down transistors PD1 and PD2, which will perform similarly, and the pass-gate transistors PG1 and PG2, which will perform similarly, it is desired that characteristics of the active region OD3 are substantially similar to the active region OD3. Accordingly, OD1 and OD2 are identified as match-sensitive features (designated by solid arrows), and OD3 and OD3 are identified as match-sensitive features (designated by dashed arrows). Each set of match-sensitive features (OD1 and OD2, OD3 and OD3) is desirably formed in a same lithography process to minimize variation in the device performance characteristics of the match-sensitive feature sets. This can ensure optimal performance, such as improved Vccmin (minimum supply voltage for a SRAM to read and write safely under a specified frequency constraint), of each SRAM cell, Cell A and Cell B.

Figure 4A:
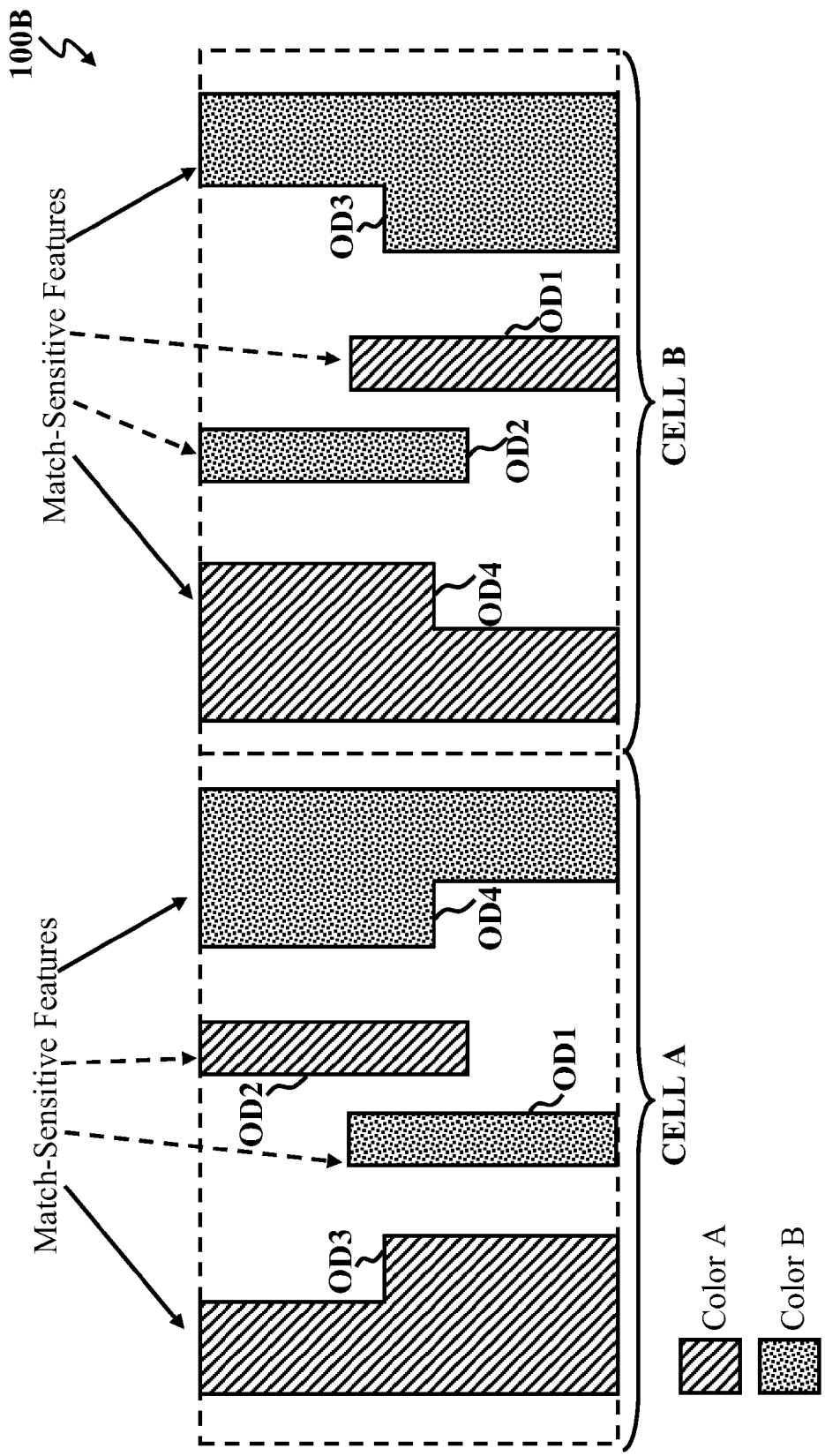
FIG. 4A and FIG. 4B illustrate a pattern layout that is evaluated and decomposed according to different multiple patterning technology methods according to various aspects of the present disclosure.
Figure 4B:
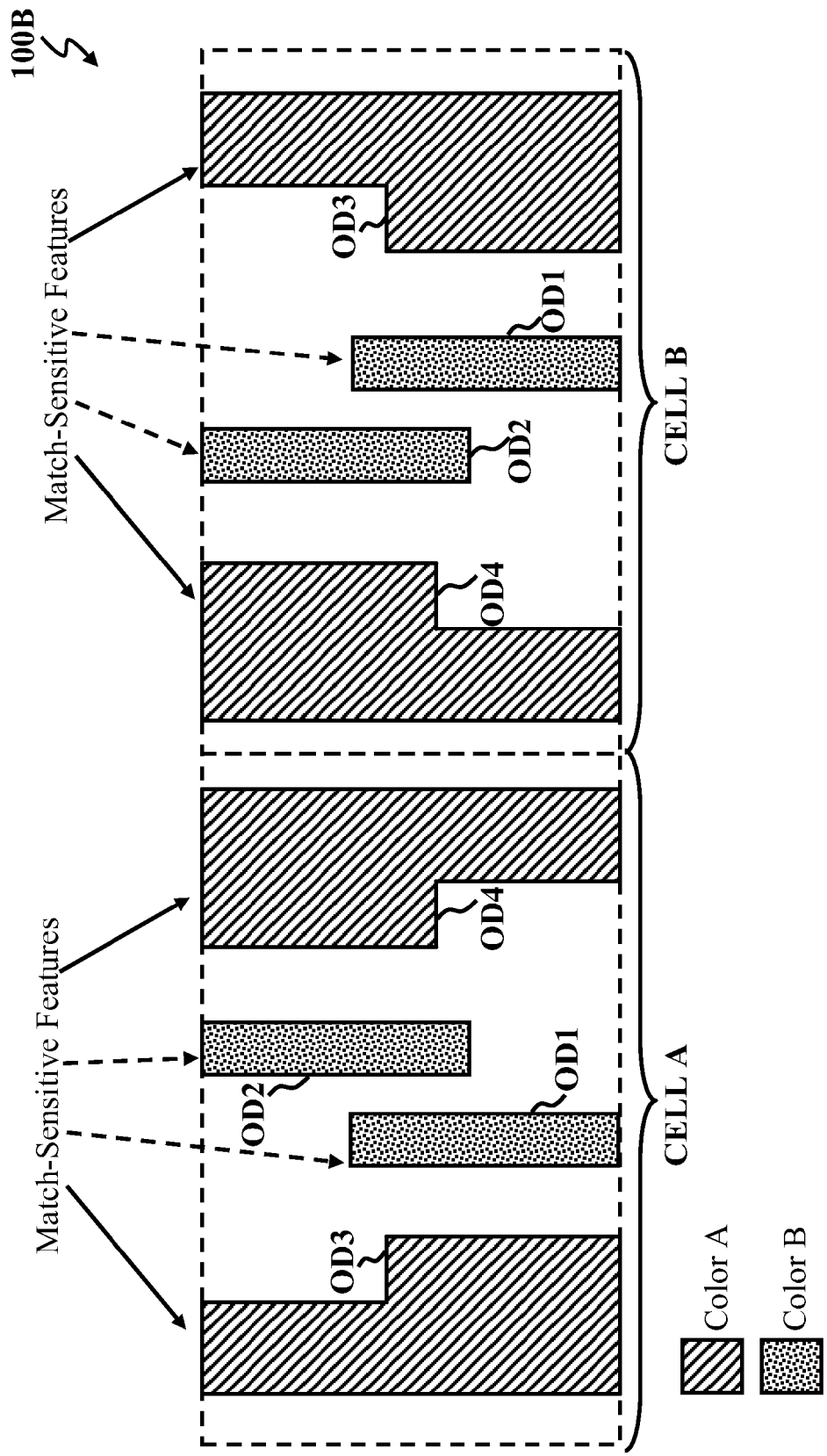

The following discussion describes applications of various MPT methods to the 6-T single-port SRAM illustrated in FIGS. 3A and 3B. The 6-T single-port SRAM serves merely as an example, and the applications disclosed herein are not limited to memory cell devices, but further may be applied to any match-sensitive integrated circuit device, such as a sense amplifier. FIG. 4A illustrates the pattern layout 100B after applying the MPT method illustrated in FIG. 1A, and FIG. 4B illustrates the pattern layout 100B after applying the MPT method illustrated in FIG. 1B. In FIG. 4A, following the MPT method illustrated in FIG. 1A, by randomly assigning every other feature of the pattern layout 100B one of two colors, the active regions OD2 and OD3 are designated Color A in Cell A, the active regions OD1 and OD4 are designated Color B in Cell A, the active regions OD2 and OD3 are designated Color B in Cell B, and the active regions OD1 and OD4 are designated Color A in Cell B. The active regions OD2 and OD3 of Cell A and active regions OD1 and OD4 of Cell B are thus formed on a first mask, and the active regions OD1 and OD4 of Cell B and active regions OD2 and OD3 of Cell B are thus formed on a second mask. For both Cell A and Cell B, this results in match-sensitive features OD1 and OD2 being formed in different lithography processes and match-sensitive features OD3 and OD4 being formed in different lithography processes. Further, corresponding features in Cell A and Cell B, such as active region OD4, are formed in different lithography processes. Because the different lithography processes may have process variations, the resulting characteristics of the active regions OD1 and OD2 are not optimized, meaning such characteristics of active regions of OD1 and OD2 may vary from each other, and the resulting characteristics of the active regions OD3 and OD4 are not optimized, meaning such characteristics of the active regions OD3 and OD4 may vary from each other. Further, if it is desired that corresponding features in Cell A and Cell B perform substantially similar, such as active region OD4, the MPT method illustrated in FIG. 1A results in such features being formed in different lithography processes, which may introduce performance variations.

In contrast, in FIG. 4B, following the MPT method illustrated in FIG. 1B, since the match-sensitive features have been identified, the MPT method automatically assigns each set of match-sensitive features a same color. By automatically assigning each set of match-sensitive features a same color, the active regions OD1 and OD2 are designated Color B, and the active regions OD3 and OD4 are designated Color A, such that the active regions OD1 and OD2 are formed on a first mask and the active regions OD3 and OD4 are formed in a second mask. This results in match-sensitive features OD1 and OD2 being formed in a same lithography process, and match-sensitive features OD3 and OD4 being formed in a same lithography processes. Further, in the depicted embodiment, corresponding features in Cell A and Cell B, such active region OD4, are formed in a same lithography process. Variations in device performance characteristics of the match-sensitive active regions are thus minimized, which can lead to overall improved device performance of each SRAM cell. Further, mask preparation time can be significantly reduced since match-sensitive features are automatically designated a same color, and then the mask preparation simply spends time assigning various coloring to the features that are not match-sensitive.

Figure 5A:
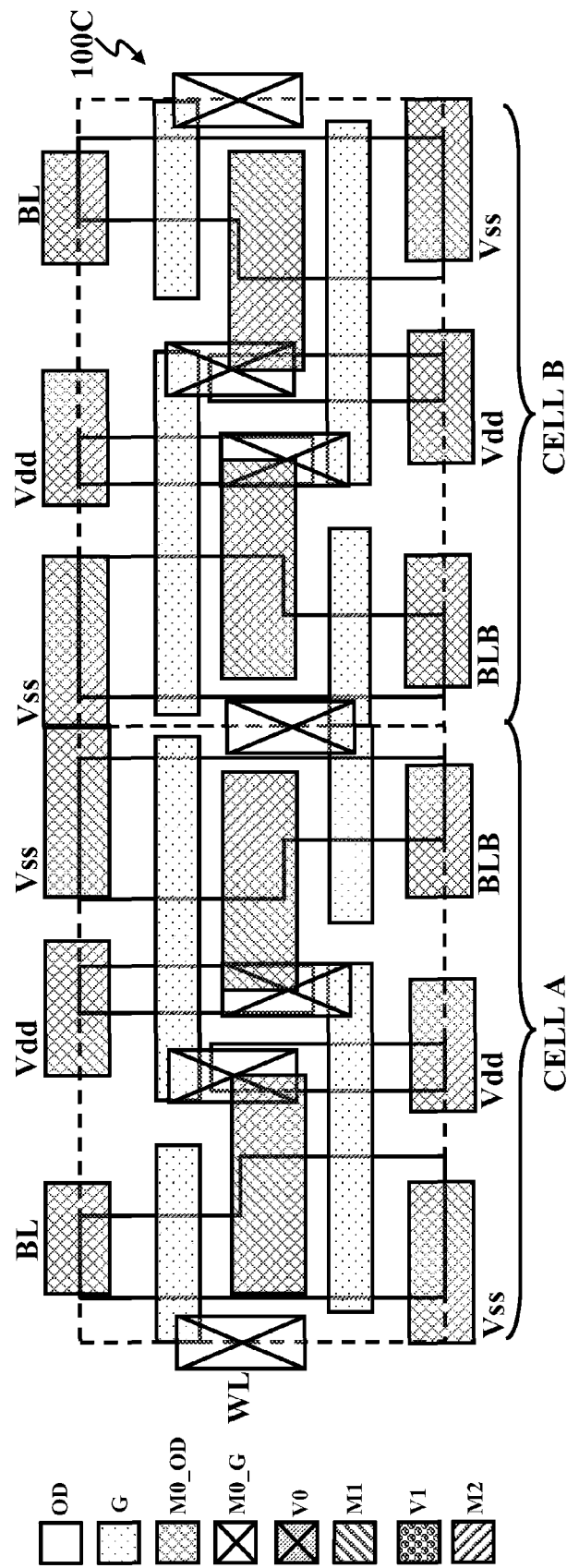
FIGS. 5A-5D illustrate various pattern layouts of the integrated circuit device of FIG. 4A and FIG. 4B, in portion or entirety, according to various aspects of the present disclosure.
Figure 5B:
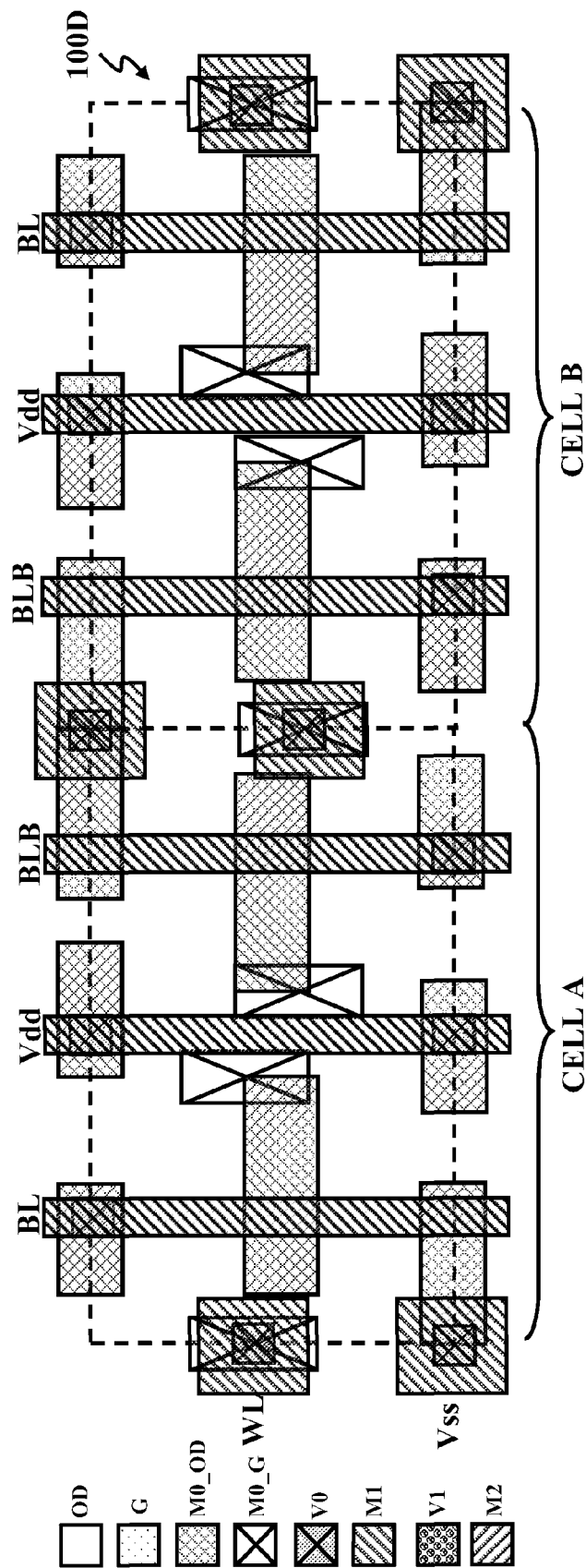
Figure 5C:
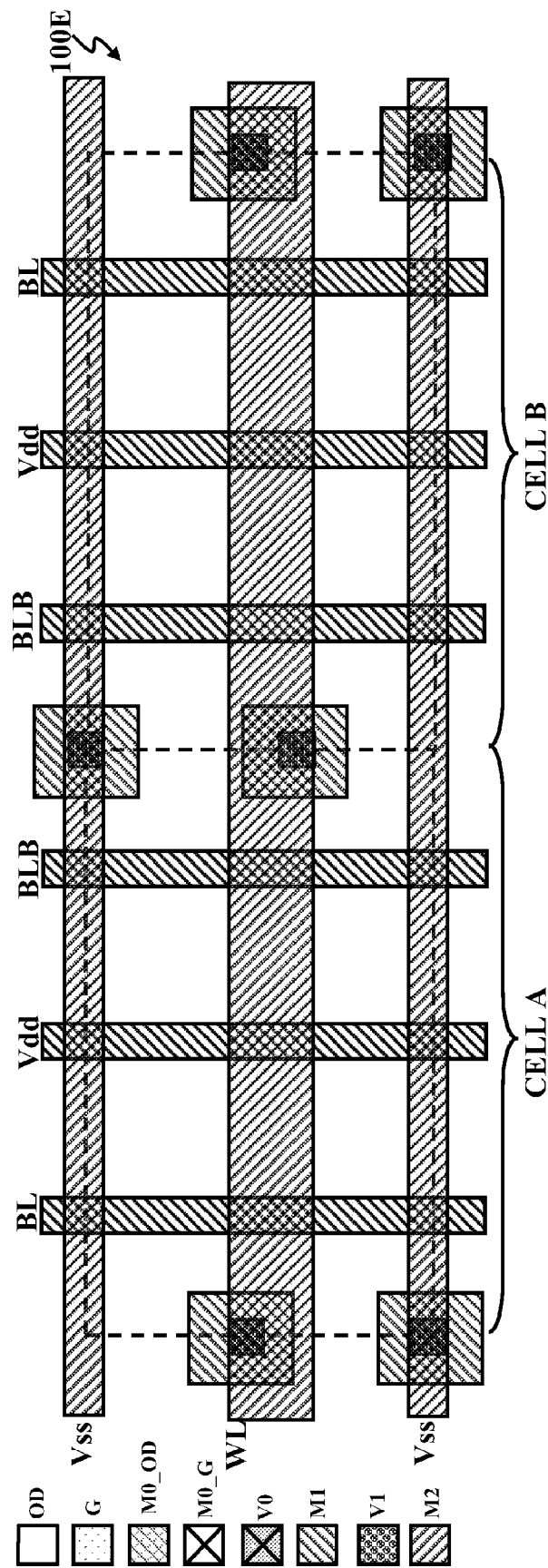
Figure 5D:
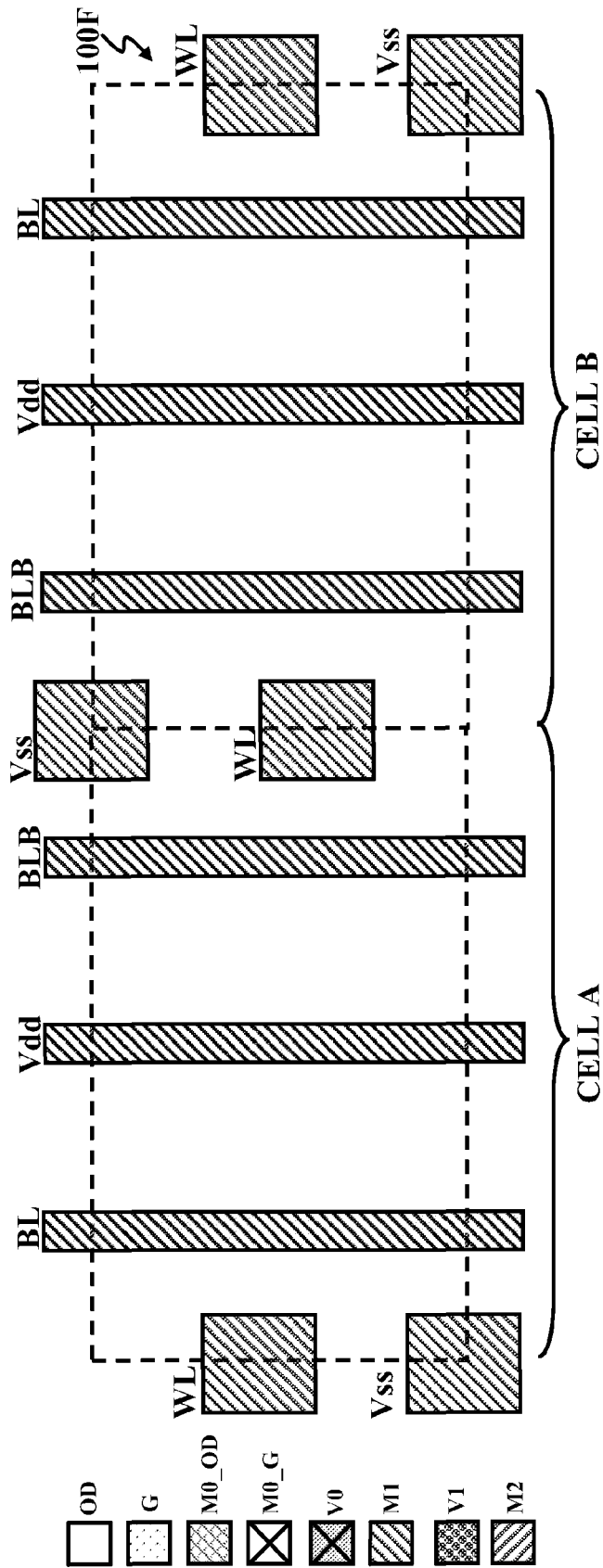

FIGS. 5A-5D illustrate various pattern layouts 100C, 100D, 100E, and 100F, respectively, of the integrated circuit device of FIGS. 4A and 4B, in portion or entirety, according to various aspects of the present disclosure. For example, in FIG. 5A, the pattern layout 100C includes the neighboring SRAM Cells A and B of pattern layout 100A in FIG. 4A. The pattern layout 100C further includes a base metal layer (M0), also referred to as a contact layer, disposed over Cells A and B. The base metal layer (M0) is a portion of a multilayer interconnection structure of the integrated circuit device. The base metal layer (M0) routes the various transistors of the SRAM Cells A and B to a bit line BL, a bit line BLB, a word line WL, a supply voltage line Vdd, and/or a supply voltage line Vss. In the depicted embodiment, the base metal layer (M0) includes metal portions that are coupled with the active regions (M0_OD) and metal portions that are coupled with the gate structures (M0_G). Some of the metal portions serve to interconnect the various transistors to the bit line BL, bit line BLB, word line WL, supply voltage line Vdd, and/or supply voltage line Vss. In FIG. 5B, the pattern layout 100D includes the base metal layer (M0) illustrated in FIG. 5A interconnected with a metal one layer (M1) by vias/contacts (V0). The metal one layer (M1) and vias/contacts (V0) are a portion of the multilayer interconnection structure. The metal one layer (M1) includes the bit line BL, the supply voltage line Vdd, and the bit line BLB. The metal one layer (M1) also includes further interconnections to the word line WL and the supply voltage line Vss. In FIG. 5C, the pattern layout 100E includes the metal one layer (M1) illustrated in FIG. 5B interconnected with a metal two layer (M2) by vias/contacts (V1). The metal two layer (M2) and vias/contacts (V1) are a portion of the multilayer interconnection structure. The metal two layer (M2) includes the supply voltage line Vss and the word line WL. In FIG. 5D, the pattern layout 100F of the integrated circuit device is reduced to the metal one layer (M1), which includes the bit line BL, the bit line BLB, the supply voltage line Vdd, and various metal interconnections to the word line WL and the supply voltage line Vss. Such metal one layer (M1) is sensitive to process variations that may arise when the pattern layout 100F is decomposed (split) into multiple masks to form the metal one layer (M1) of the integrated circuit device. For example, the metal one layer (M1), specifically the bit line BL, the bit line BLB, and the supply voltage line Vdd, are routed to the active regions and the gate structures of the SRAM Cells A and B via the base metal layer (M0); and the metal one layer (M1), specifically the various metal interconnections, routes the active regions and gate structures of the SRAM Cells A and B to the metal two layer (M2), specifically the word line WL and the supply voltage line Vss. Overlay and symmetry of the metal one layer (M1) can thus affect device performance. Accordingly, metal one layer (M1) can benefit from being decomposed using the MPT method illustrated in FIG. 1B.

Figure 6A:
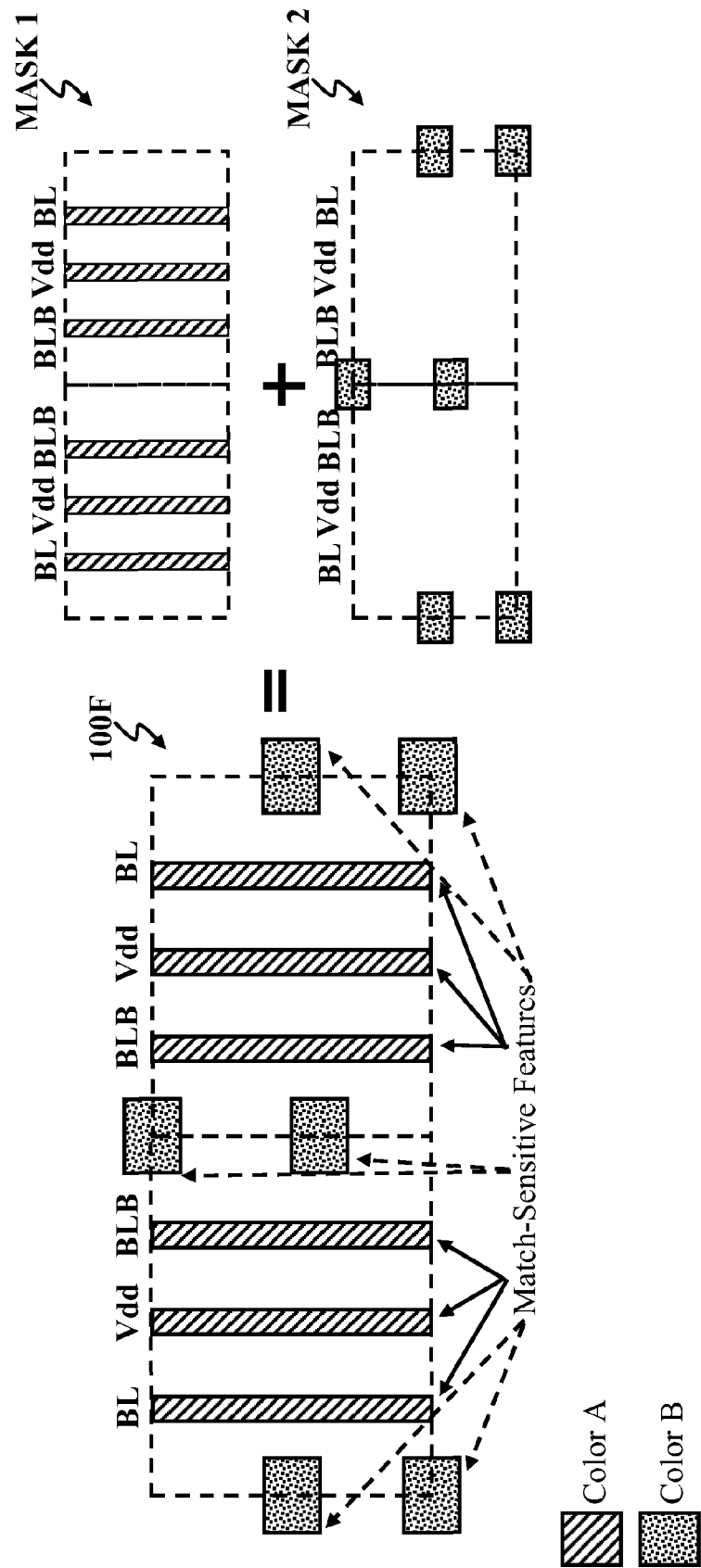
FIG. 6A and FIG. 6B illustrate a pattern layout that is evaluated and decomposed according to different multiple patterning technology methods according to various aspects of the present disclosure.
Figure 6B:
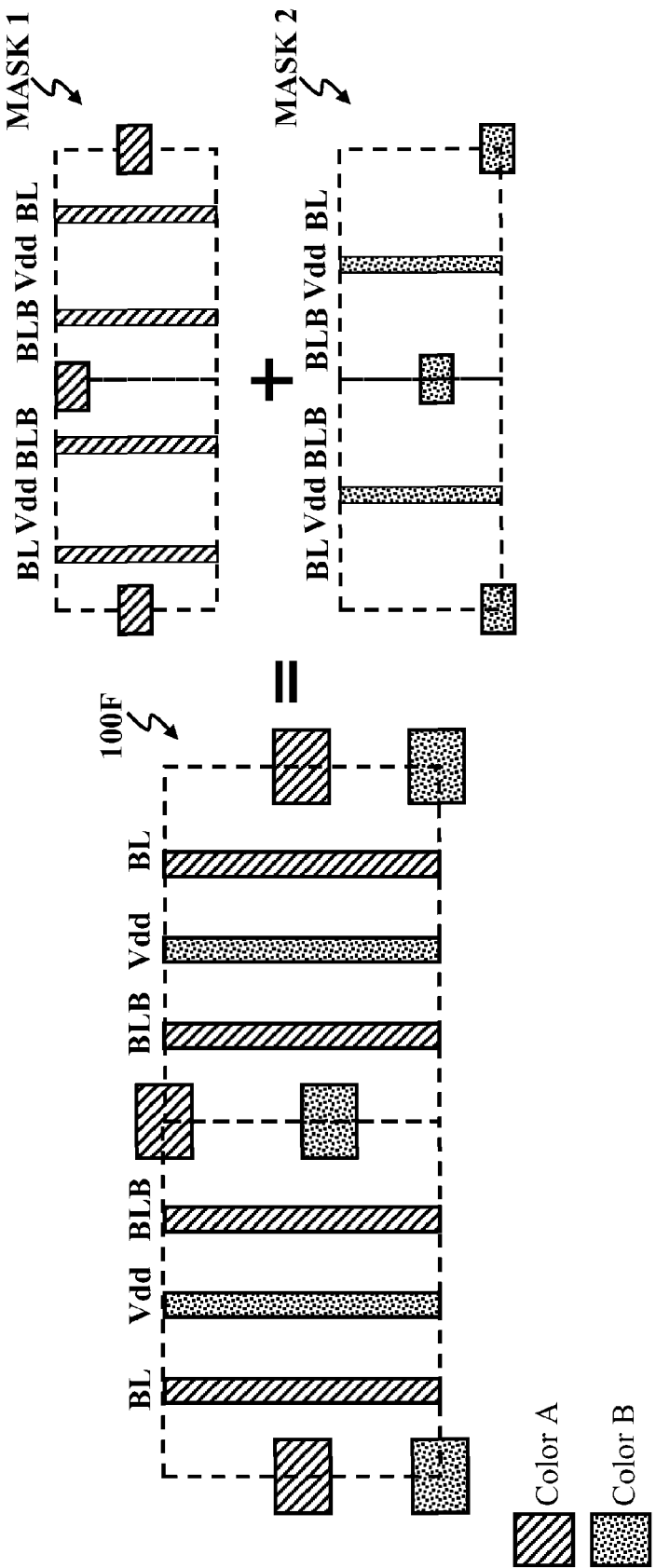

FIG. 6A illustrates the pattern layout 100F after applying the MPT method illustrated in FIG. 1B, and FIG. 6B illustrates the pattern layout 100F after applying the MPT method illustrated in FIG. 1A. In FIG. 6A, following the MPT method illustrated in FIG. 1B, since match-sensitive features have been identified, the MPT method automatically assigns each set of match-sensitive features a same color. For example, in the depicted embodiment, the bit line BL, the supply voltage line Vdd, and the bit line BLB are designated as match-sensitive features. Such features are match-sensitive since quality of routing from the transistors of each Cell A and Cell B to respective bit line BL, supply voltage line Vdd, and bit line BLB can affect performance of the integrated circuit device. Symmetry of the bit line BL, the supply voltage line Vdd, and the bit line BLB is also affects performance of the integrated circuit device. Further, symmetry and placement of the various metal interconnections that route the active regions and the gate structures of the SRAM Cells A and B to the metal two layer (M2), specifically the word line WL and the supply voltage line, can effect performance of the integrated circuit device. Here, by automatically assigning each set of match-sensitive features a same color, the bit line BL, the supply voltage line Vdd, and the bit line BLB are designated Color A, such that the active regions OD1 and OD2 are formed on a first mask (Mask 1). Further, the various metal interconnections that route the active regions and the gate structures of the Cells A and B to the metal two layer (M2) are designated Color B, such that these various metal interconnections are formed in a second mask (Mask 2). This results in each set of match-sensitive features being formed in a same lithography process. Mask 1 and Mask 2 may be used in any order during the lithography process used to form the various features of the pattern layout 100F in a resist layer of a wafer of the integrated circuit device. Variations in placement/routing of the various match-sensitive features of the pattern layout 100F is thus minimized, which can lead to overall improved device performance of each SRAM cell. Further, mask preparation time can be significantly reduced since match-sensitive features are automatically designated a same color, and then the mask preparation simply spends time assigning various coloring to the features that are not match-sensitive. In contrast, in FIG. 6B, following the MPT method illustrated in FIG. 1A, by randomly assigning every other feature of the pattern layout 100F one of two colors, the bit line BL, bit line BLB, and some of the various metal interconnection features are designated Color A, and the supply voltage line Vdd and some of the various metal interconnection features are designated Color B. The bit line BL, bit line BLB, and some of the various metal interconnection features are thus formed on a first mask (Mask 1), and the supply voltage line Vdd and some of the various metal interconnection features are thus formed on a second mask (Mask 2). For both Cell A and Cell B, this results in match-sensitive features being formed in different lithography processes. Because the different lithography processes may have process variations, the resulting placement/routing and characteristics of the match-sensitive features is not optimized so that performance of the resulting integrated circuit device is optimized. Such process variation is particularly evident when overlay of the lithography processes using each mask is considered.

Figure 7A:
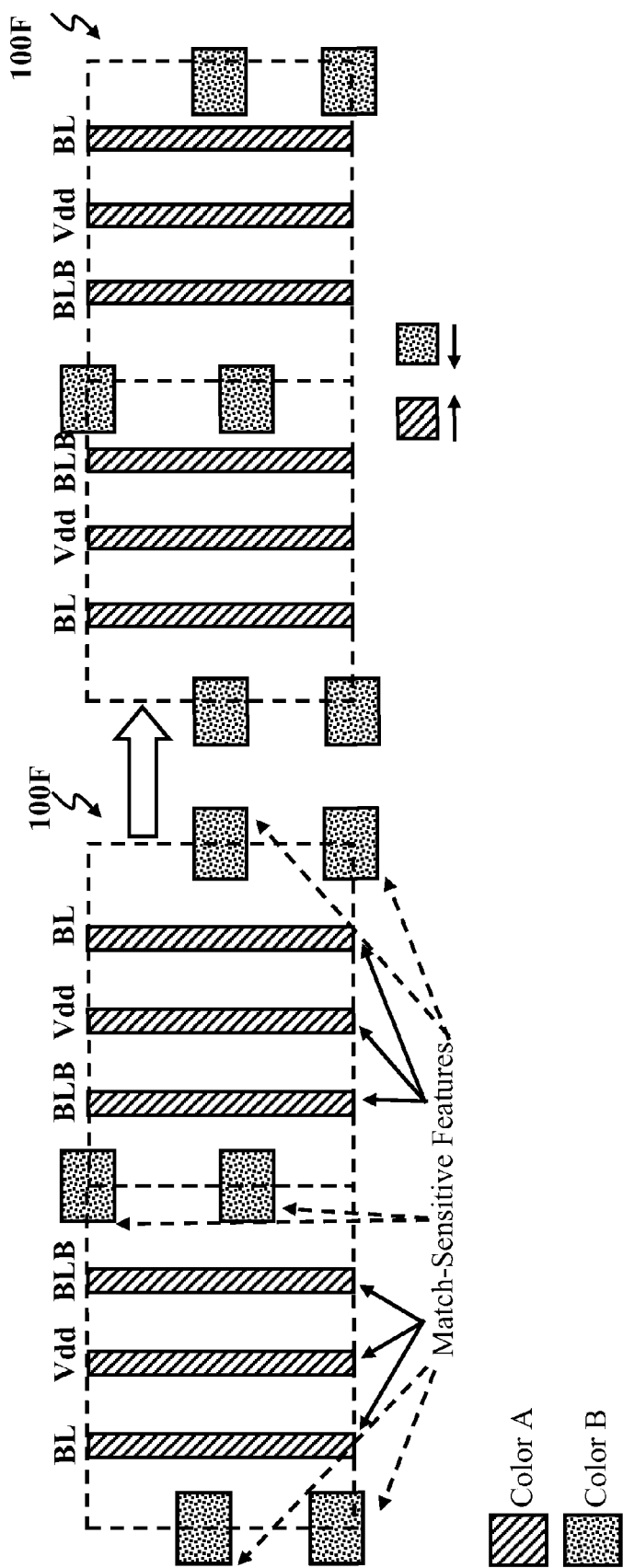
FIG. 7A and FIG. 7B respectively illustrate the pattern layouts of FIG. 6A and FIG. 6B when considering overlay issues according to various aspects of the present disclosure.
Figure 7B:
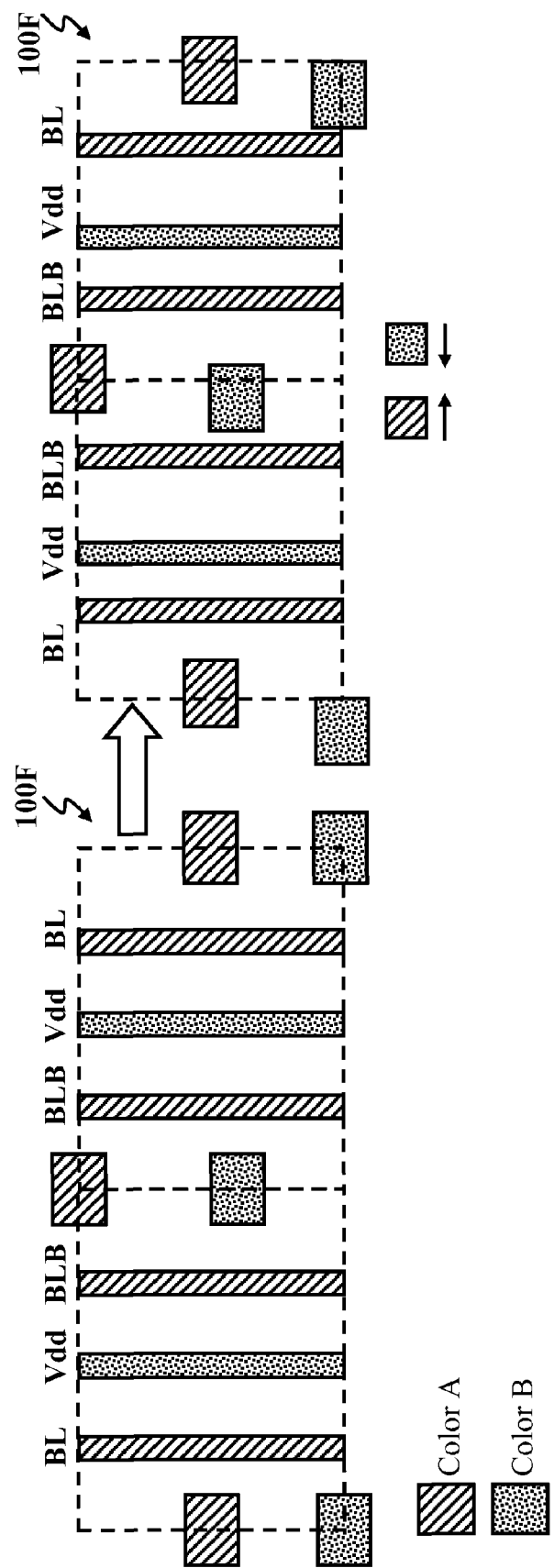

FIG. 7A illustrates the pattern layout 100F after applying the MPT method illustrated in FIG. 1B and accounts for overlay issues that may arise during processing, and FIG. 7B illustrates the pattern layout 100F after applying the MPT method illustrated in FIG. 1A and accounts for overlay issues that may arise during processing. In FIGS. 7A and 7B, the pattern layout 100F is assigned coloring just as the pattern layouts 100F illustrated respectively in FIGS. 6A and 6B. When the respective Mask 1/Mask 2 combinations of FIGS. 7A and 7B (see the Mask 1/Mask 2 combinations of FIGS. 6A and 6B, respectively) are used in more than one lithography process to form the pattern layout 100F, overlay error should be considered. Overlay error may be defined as a difference between an actual position of a feature of the pattern layout relative to a desired position of the feature. Such overlay error can arise from alignment issues and/or optical errors in a lithography apparatus used for the lithography processes. Such overlay error may also arise from other processing factors. In the depicted embodiment, the pattern layouts 100F on the left of FIGS. 7A and 7B illustrate desired positions of the features of the pattern layouts 100F, and the pattern layouts 100F on the right illustrate the actual positions of the features of the pattern layouts 100F when considering overlay issues. For example, the features of the pattern layouts 100F that are assigned Color A are shifted to the right, and the features of the pattern layouts 100F that are assigned Color B are shifted to the left. In FIG. 7A, where the pattern layout 100F is colored and assigned to masks according to the MPT method illustrated in FIG. 1B, the match-sensitive features are shifted similarly since such match-sensitive features are formed in a same lithography process. More specifically, the bit line BL, the supply voltage line Vdd, and the bit line BLB are all shifted to the right a same distance, and the various metal interconnection features are all shifted to the left a same distance. The bit line BL, the supply voltage line Vdd, and the bit line BLB thus remain substantially symmetrical relative to one another. In contrast, in FIG. 7B, where the pattern layout 100F is colored and assigned to masks according to the MPT method illustrated in FIG. 1A, the match-sensitive features are not shifted similarly since such match-sensitive features are formed in different lithography processes. More specifically, the bit line BL and the bit line BLB are shifted to the right, and the supply voltage line Vdd is shifted to the left. Similarly, some of the metal interconnection features are shifted to the right, and some of the metal interconnection features are shifted to the left. The various match-sensitive features are thus not as symmetrical as the pattern layout 100F illustrated in FIG. 7A. Further, it is noted that, when considering overlay, the resulting pattern layout 100F achieved in FIG. 7A more closely resembles the actual pattern layout 100F than the resulting pattern layout 100F in FIG. 7B. Accordingly, routing and placement of the various features is better preserved and matched by implementing the MPT method that considers match-sensitive features.

Figure 8A:
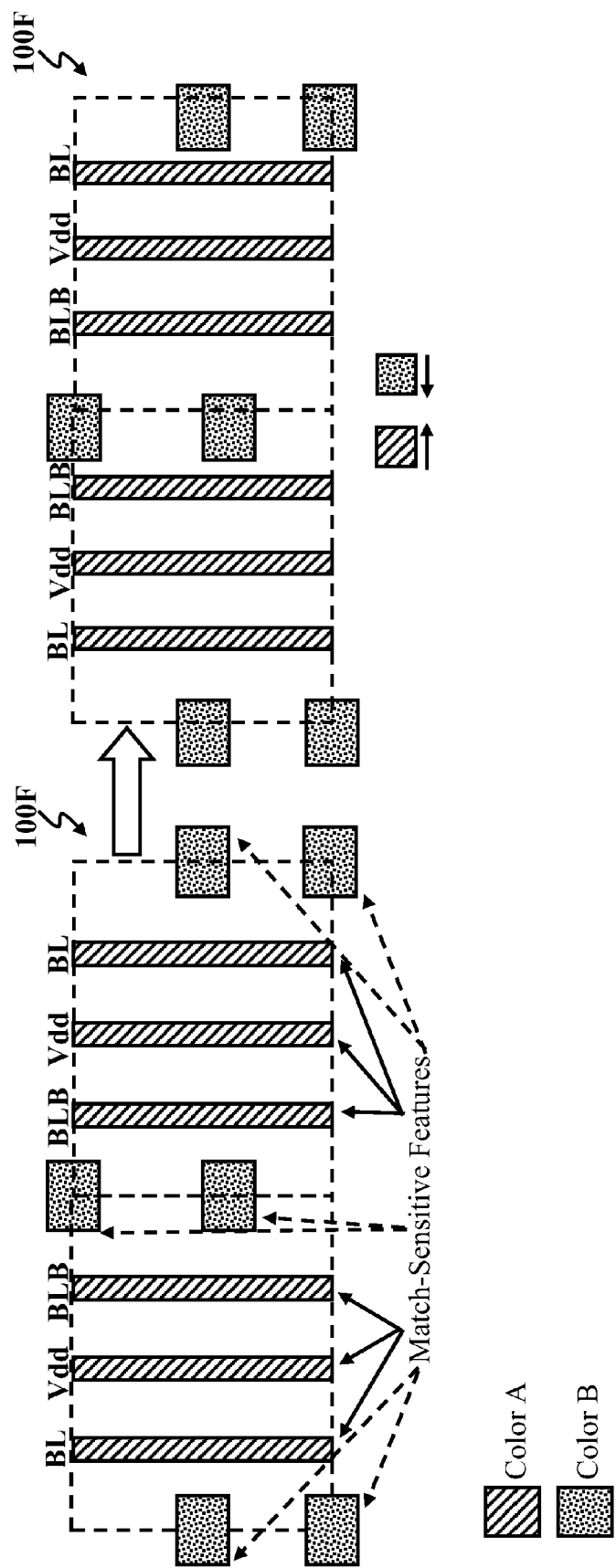
FIG. 8A and FIG. 8B illustrate a pattern layout that is evaluated and decomposed according to different multiple patterning technology methods when considering overlay issues according to various aspects of the present disclosure.
Figure 8B:
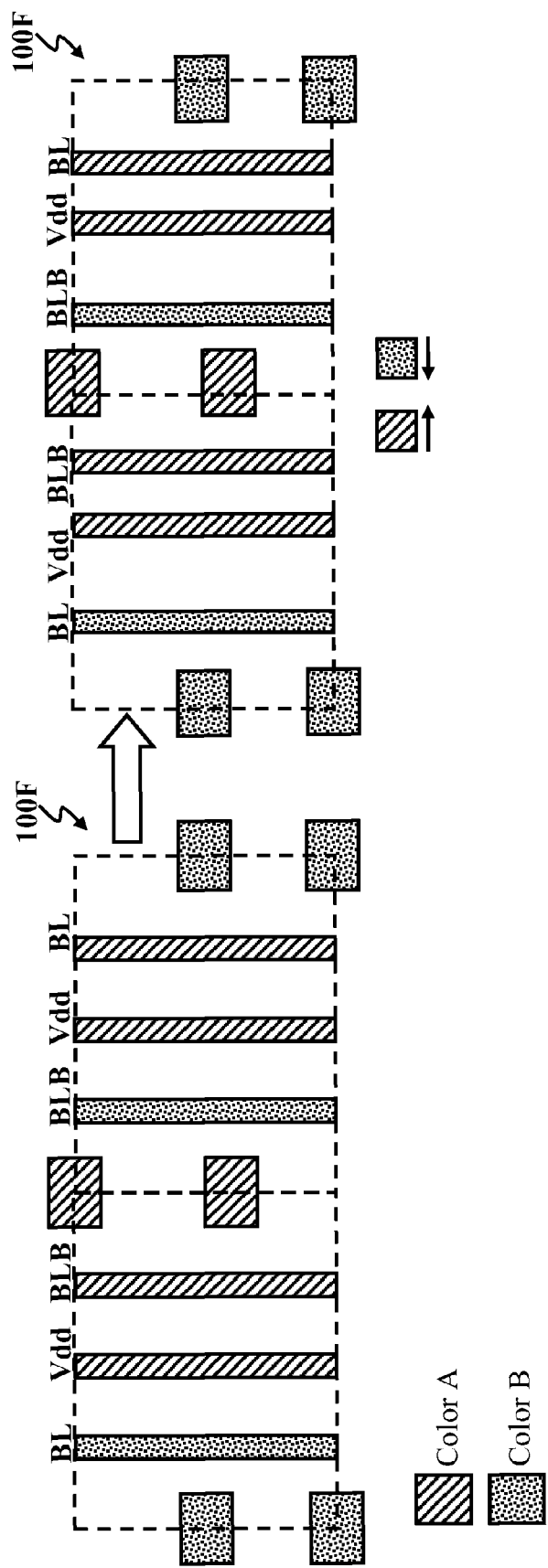

FIG. 8A illustrates the pattern layout 100F after applying the MPT method illustrated in FIG. 1B and accounts for overlay issues that may arise during processing, and FIG. 8B illustrates the pattern layout 100F after applying another MPT method and accounts for overlay issues that may arise during processing. In FIG. 8A, the pattern layout 100F is assigned coloring just as the pattern layout 100F illustrated in FIG. 7A, and the resulting pattern layout 100F considering overlay issues is just as illustrated in FIG. FIG. 7B. In FIG. 8B, an MPT method assigns and colors the pattern layout 100F, such that the colored pattern layout 100F exhibits asymmetrical pattern assignment. More specifically, the supply voltage line Vdd, the bit line BL, and various metal interconnection features are assigned Color A; and the bit line BL and various metal interconnection features are assigned Color B. When overlay is considered, the match-sensitive features are not shifted similarly since such match-sensitive features are formed in different lithography processes. More specifically, the bit line BL is shifted to the left, and the bit line BLB and the supply voltage line Vdd is shifted to the right. Similarly, some of the metal interconnection features are shifted to the right, and some of the metal interconnection features are shifted to the left. The various match-sensitive features in the pattern layout 100F illustrated in FIG. 8B are thus not as symmetrical as the pattern layout 100F illustrated in FIG. 8A. Further, it is noted that, when considering overlay, the resulting pattern layout 100F achieved in FIG. 8A more closely resembles the actual pattern layout 100F than the resulting pattern layout 100F in FIG. 8B. Accordingly, routing and placement of the various features is better preserved and matched by implementing the MPT method that considers match-sensitive features.

Figure 9:
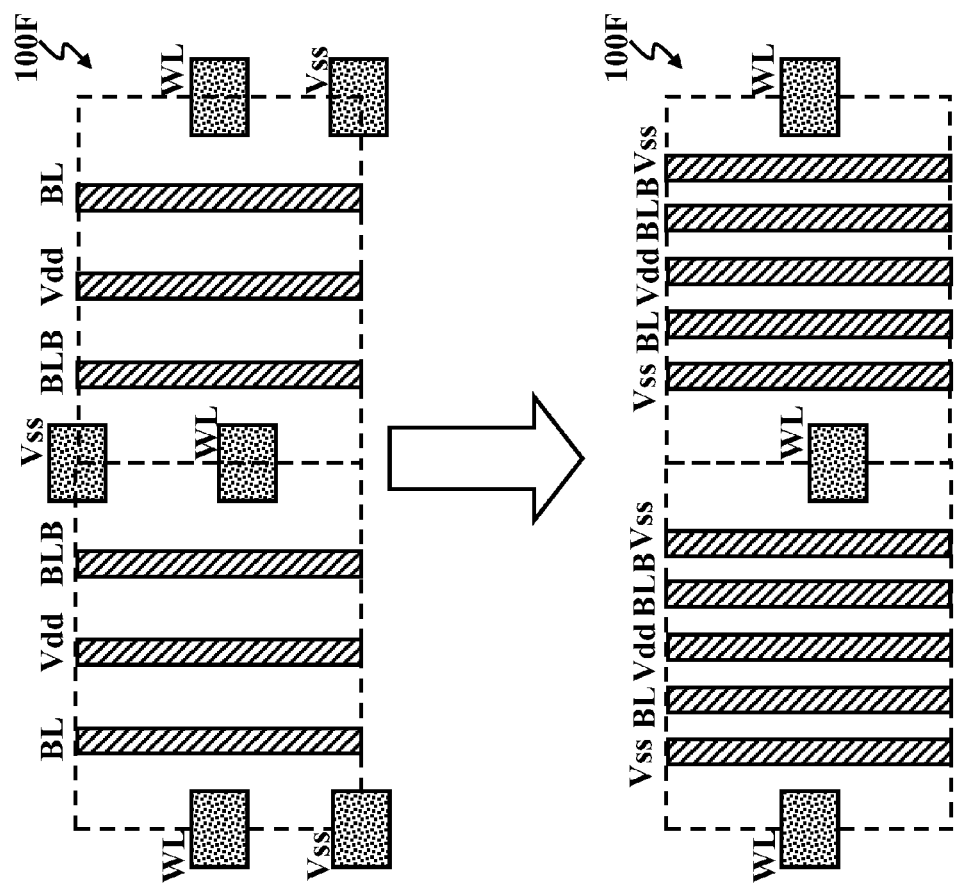
FIG. 9 illustrates the pattern layout of FIG. 5D before and after a rerouting process according to various aspects of the present disclosure.

The disclosed MPT method, which seeks to include match-sensitive features in a same lithography process, may provide rerouting of various features of a pattern layout. For example, FIG. 9 illustrates the pattern layout 100F before and after rerouting, where various metal interconnection features associated with the supply voltage line Vss (which may be referred to as supply voltage Vss islands) are rerouted in a same direction as the bit line BL, such that a supply voltage line Vss is formed in a same lithography process as the bit line BL, the supply voltage line Vss, and the bit line BLB. Such rerouting may be performed where the Cell A and Cell B have a smaller allowable pitch. In this alternative, the word line can then be routed through a lower or higher metal layer when compared to the routing of the bit lines BL and BLB. Various pattern layouts may thus be rerouted to ensure that match-sensitive features are formed in a same lithography process.

The present disclosure provides various multiple patterning technology methods for decomposing a pattern layout and systems for implementing such methods. Such methods identify match-sensitive features of a pattern layout so that match-sensitive features are formed in a same lithography process. This can reduce variations in routing paths and/or device characteristics of similar devices, which can improve overall device performance. In an example, match-sensitive features of a pattern layout of an integrated circuit device are identified so that match-sensitive features are automatically assigned a same color, and features that are not match-sensitive features are then assigned coloring based on an appropriate multiple patterning technology method. By identifying match-sensitive features, mask making time can be significantly reduced. Different embodiments may have different advantages, and that no particular advantage is necessarily required of any embodiment.

The present disclosure can take the form of an entirely hardware embodiment, an entirely software embodiment, or an embodiment containing both hardware and software elements. In an example, an electronic design automation (EDA) apparatus may implement the methods described herein. Furthermore, embodiments of the present disclosure can take the form of a computer program product accessible from a tangible computer-usable or computer-readable medium providing program code for use by or in connection with a computer or any instruction execution system. For purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The present disclosure provides for many embodiments. In an example, a method includes receiving a pattern layout having a plurality of features; coloring each of the plurality of features one of at least two colors, thereby forming a colored pattern layout, wherein the coloring includes coloring match-sensitive features a same color; and fabricating at least two masks with the features of the colored pattern layout, wherein each mask includes features of a single color. Coloring the match-sensitive features the same color may include identifying at least two of the plurality of features having a same device performance characteristic; and coloring the at least two of the plurality of features having the same device performance characteristic the same color. The device characteristic performance characteristic may be one of threshold voltage, parasitic capacitance, parasitic resistance, and combinations thereof. Coloring the match-sensitive features the same color may include identifying at least two of the plurality of features having a symmetrical routing path; and assigning the at least two of the plurality of features having the symmetrical routing path the same color.

The method may further include identifying the match-sensitive features of the plurality of features before coloring each of the plurality of features. The identifying the match-sensitive features of the plurality of features before coloring may include identifying features from the plurality of features that should be formed in a same lithography process. The method may further include performing a design rule check on the colored pattern layout. The method may further include performing a lithography process on a resist layer with each of the at least two masks, such that the pattern layout having the plurality of features is transferred to the resist layer. The method may further include transferring the pattern layout having the plurality of features from the resist layer to a wafer, the resist layer being disposed over the wafer.

In another example, a method includes receiving a pattern layout of an integrated circuit device having a plurality of features, wherein match-sensitive feature sets of the plurality of features are identified; coloring each of the plurality of features one of at least two colors, thereby forming a colored pattern layout, wherein the coloring includes coloring each of the match-sensitive features a same color; and fabricating at least two masks with the features of the colored pattern layout, wherein each mask includes features of a single color. The match-sensitive feature sets may be sets of features to be formed in a same lithography process. The match-sensitive feature sets may be sets of features having a same device performance characteristic. The method may further include verifying that features colored a same color in the colored pattern layout comply with a design rule.

In an example, receiving the pattern layout, wherein match-sensitive feature sets of the plurality of features are identified, includes receiving a pattern layout of a static random access memory (SRAM) cell that includes a first active region, a second active region, a third active region, and a fourth active region, a bit line BL, a supply voltage line Vdd, and a bit line BLB, wherein the first and second active regions are respectively associated with a first pull-up transistor and a second pull-up transistor and the third and fourth active regions are respectively associated with a first pull-down transistor and a second pull-down transistors. The bit line BL, the supply voltage line Vdd, and the bit line BLB are identified as a first match-sensitive feature set; the first active region and the second active region are identified as a second match-sensitive feature set; and the third active region and the fourth active region are identified as a third match-sensitive feature set. Fabricating at least two masks with the features of the colored pattern layout may include fabricating a mask having the bit line BL, the supply voltage line Vdd, and the bit line BLB. The method may further include forming the SRAM cell using the mask having the bit line BL, the supply voltage line Vdd, and the bit line BLB, such that a bit line BL, a supply voltage line Vdd, and a bit line BLB of the SRAM cell are formed in a same lithography process. Fabricating at least two masks with the features of the colored pattern layout, wherein each mask includes features of a single color, may include fabricating a first mask having the first active region and the second active region; and fabricating a second mask having the third active region and the fourth active region. The method may further include forming the SRAM cell using the first mask and the second mask, such that the first and second active regions of the SRAM cell are formed in a same lithography process and the third and fourth active regions of the SRAM cell are formed in a same lithography process.

In an example, an apparatus includes a computer readable medium that stores a plurality of instructions for execution by at least one computer processor, wherein the instructions are for: receiving a pattern layout having a plurality of features; coloring each of the plurality of features one of at least two colors, thereby forming a colored pattern layout, wherein the coloring includes coloring match-sensitive features a same color; and fabricating at least two masks with the features of the colored pattern layout, wherein each mask includes features of a single color. The receiving the pattern layout may include receiving a pattern layout that identifies the match-sensitive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    receiving a pattern layout having a plurality of features forming an integrated circuit device;
    identifying a first transistor and a second transistor in the pattern layout that have a desired similar performance in the integrated circuit device when fabricated, wherein the desired similar performance in the integrated circuit device is one of threshold voltage, saturation current, leakage current, parasitic capacitance, parasitic resistance, and combinations thereof;
    identifying a first feature of the first transistor and a second feature of the second transistor, wherein the first and second features have a desired similar performance for the first feature's device performance characteristic and the second feature's device performance characteristic in the fabricated device of the integrated circuit device;

coloring, by a computer, each of the plurality of features of the pattern layout one of at least two colors, thereby forming a colored pattern layout, wherein the coloring includes coloring the identified first and second features the same color; and fabricating at least two masks with the features of the colored pattern layout, wherein each mask includes features of a single color;

performing a first lithography process to image the first and second features using a first mask of the at least two masks; and performing a second lithography process to image another feature defined by the pattern layout using a second mask of the at least two masks.

2. The method of claim 1 further comprising:
identifying at least two of the plurality of features that have a routing path to each of the two of the plurality of features that are symmetrical; and
assigning the at least two of the plurality of features having the symmetrical routing path the same color.

3. The method of claim 1 wherein the first and second features are formed in a same lithography process.

4. The method of claim 1 further including performing a design rule check on the colored pattern layout.

5. The method of claim 1 further including performing a lithography process on a resist layer with each of the at least two masks, such that the pattern layout having the plurality of features is transferred to the resist layer.

6. The method of claim 5 further including transferring the pattern layout having the plurality of features from the resist layer to a wafer, the resist layer being disposed over the wafer.

7. A method comprising:
receiving a pattern layout of an integrated circuit device having a plurality of features, wherein match-sensitive feature sets of the plurality of features are identified, wherein the receiving the pattern layout includes:
receiving a pattern layout of a static random access memory (SRAM) cell that includes the plurality of features including a first active region, a second active region, a third active region, and a fourth active region, a bit line BL, a supply voltage line Vdd, and a bit line BLB, wherein the first and second active regions are respectively associated with a first pull-up transistor and a second pull-up transistor and the third and fourth active regions are respectively associated with a first pull-down transistor and a second pull-down transistor;
coloring, by a computer, each of the plurality of features one of at least two colors, thereby forming a colored pattern layout, wherein the coloring includes coloring each of the match-sensitive feature sets a same color, wherein the match-sensitive feature sets are sets of features to be formed in a same lithography process, wherein the coloring includes:
the bit line BL, the supply voltage line Vdd, and the bit line BLB are identified as a first match-sensitive feature set and colored a first color;
the first active region and the second active region are identified as a second match-sensitive feature set and colored a second color; and
the third active region and the fourth active region are identified as a third match-sensitive feature set; and fabricating at least two masks with the features of the colored pattern layout, wherein each mask includes features of a single color.

8. The method of claim 7 further including verifying that features colored a same color in the colored pattern layout comply with a design rule.

9. The method of claim 7 wherein the fabricating at least two masks with the features of the colored pattern layout, wherein each mask includes features of a single color, includes fabricating a mask having the bit line BL, the supply voltage line Vdd, and the bit line BLB.

10. The method of claim 9 further including forming the SRAM cell using the mask having the bit line BL, the supply voltage line Vdd, and the bit line BLB, such that a bit line BL, a supply voltage line Vdd, and a bit line BLB of the SRAM cell are formed in a same lithography process.

11. The method of claim 7 wherein the fabricating at least two masks with the features of the colored pattern layout, wherein each mask includes features of a single color, includes:
fabricating a first mask having the first active region and the second active region; and
fabricating a second mask having the third active region and the fourth active region.

12. The method of claim 11 further including forming the SRAM cell using the first mask and the second mask, such that the first and second active regions of the SRAM cell are formed in a same lithography process and the third and fourth active regions of the SRAM cell are formed in a same lithography process.

13. A method, comprising:
receiving a pattern layout of an integrated circuit device;
identifying a first cell of a memory device and a second cell of a memory device in the pattern layout;
identifying at least two routing lines to the first cell and the second cell wherein the at least two routing lines are match-sensitive features having a desired symmetrical routing to the first and second cells and are sets of features to be formed in a same lithography process;
identifying at least two other routing lines to the first cell and the second cell wherein the at least two other routing lines are match-sensitive features having a desired symmetrical routing to the first and second cells;
coloring each of at least two routing one color, and coloring each of the at least two other routing lines a second color thereby forming a colored pattern layout; and
fabricating at least two masks with the features of the colored pattern layout, wherein each mask includes features of a single color.

14. The method of claim 1, wherein the identifying the first feature of the first transistor includes identifying a first active region, and identifying the second feature of the second transistor includes identifying a second active region.

15. The method of claim 1, wherein the identifying the first transistor and the second transistor includes identifying two transistors of a single static random access memory (SRAM) cell.

16. The method of claim 1 further comprising:
identifying at least two of memory cells in the pattern layout, wherein the at least two memory cells have a desired substantially similar performance; and
assigning corresponding features of the at least two memory cells the same color in the colored layout pattern.

* * * * *